(12) United States Patent
Lin et al.

(10) Patent No.: US 7,766,074 B2
(45) Date of Patent: Aug. 3, 2010

(54) HEAT-DISSIPATING DEVICE HAVING AIR-GUIDING STRUCTURE

(75) Inventors: Kuo-Len Lin, Wugu Township, Taipei County (TW); Ken Hsu, Wugu Township, Taipei County (TW); Wen-Jung Liu, Wugu Township, Taipei County (TW)

(73) Assignees: CPUMATE Inc., Taipei (TW); Golden Sun News Techniques Co., Ltd., Taipei (TW)

( * ) Notice: Subject to any disclaimer, the term of this patent is extended or adjusted under 35 U.S.C. 154(b) by 1118 days.

(21) Appl. No.: 11/383,190

(22) Filed: May 12, 2006

(65) Prior Publication Data

US 2007/0261822 A1 Nov. 15, 2007

(51) Int. Cl.
*F28F 7/00* (2006.01)
*F28D 15/00* (2006.01)
(52) U.S. Cl. .................. 165/80.2; 165/104.33; 165/121
(58) Field of Classification Search ................. 165/80.2, 165/80.3, 80.4, 104.33, 120, 121
See application file for complete search history.

(56) References Cited

U.S. PATENT DOCUMENTS 6,779,595 B1 * 8/2004 Chiang ........................ 165/121
6,915,844 B2 * 7/2005 Chou ........................ 165/80.3
6,967,845 B2 * 11/2005 Chiang et al. ............... 165/80.3
7,073,568 B2 * 7/2006 Chen et al. ............. 165/104.33
7,215,548 B1 * 5/2007 Wu et al. .................... 165/80.3

FOREIGN PATENT DOCUMENTS

TW M265695 5/2005

* cited by examiner

*Primary Examiner*—Ljiljana (Lil) V Ciric
(74) *Attorney, Agent, or Firm*—Chun-Ming Shih; HDLS IPR Services

(57) ABSTRACT

A heat-dissipating device having an air-guiding structure includes a heat-conducting seat, a fin assembly, at least one heat pipe for serially connecting to the fin assembly and the heat-conducting seat, and a fan assembly unit. The fin assembly is positioned above the heat-conducting seat and formed by arranging a plurality of heat-dissipating fins at intervals. As a result, airflow paths are formed between each heat-dissipating fin. The fan assembly unit is laterally provided at one side of the fin assembly. A space for lateral flow is formed between the heat-conducting seat and the fin assembly. The other side of the fin assembly is provided with an air-guiding member. The air-guiding member has a guiding space for laterally communicating with the space. The air blown by the fan assembly unit can pass through the space and is received by the air-guiding member. Then, the air flow is guided to the portions to be heat-dissipated by the air-guiding member.

13 Claims, 5 Drawing Sheets

HEAT-DISSIPATING DEVICE HAVING AIR-GUIDING STRUCTURE

BACKGROUND OF THE INVENTION

1. Field of the Invention

The present invention relates to a heat-dissipating device having an air-guiding structure and in particular a heat-dissipating device capable of dissipating the heat generated by the transistors around the CPU and reducing the ambient temperature of the periphery of the CPU.

2. Description of Prior Art

A heat sink or heat-dissipating device is used to facilitate the heat dissipation of the central processing unit (CPU). Also, heat-dissipating fins are used to form an air-guiding structure to help the heat sink or heat-dissipating device to dissipate the heat generated by the electronic elements in the periphery of the CPU. Such kind of heat-dissipating device is for example disclosed in Taiwan Patent Publication No. M265695 entitled "Heat-dissipating device having air-guiding structure".

According to the above, in the existing heat sink or heat-dissipating device, in order to facilitate the heat dissipation of the heat-generating electronic elements in the periphery of the CPU, it is necessary to design an air-guiding structure to guide the airflow to the periphery of the heat-generating electronic elements intended to be heat-dissipated. The solution for air-guiding structure is achieved by either directing the flowing paths formed between each heat-dissipating fin toward the heat-generating elements or providing air-guiding pieces on each heat-dissipating fin, so that the airflow can be guided to the heat-generating elements. However, since each heat-dissipating fin is serially provided on the heat pipe to facilitate to reduce the temperature of the condensed end of the heat pipe, the flowing path between each heat-dissipating fin has already reached a certain high temperature. If the heat dissipation of the heat-generating elements is achieved by the airflow blowing through the above heat-dissipating fins, the temperature difference is too small and thus insufficient or even unhelpful for heat dissipation.

In view of the above, the inventor proposes the present invention to overcome the above problems based on his expert experiences and deliberate researches.

SUMMARY OF THE INVENTION

The present invention is to provide a heat-dissipating device having an air-guiding structure capable of facilitating the heat-dissipating device to dissipate the heat generated by the CPU, and further dissipating the heat generated by the transistors around the CPU. With the space between the heat-conducting seat of the heat-dissipating device and the fin assembly, the airflow can be blown through the space to the transistors around the CPU. In this way, the airflow with lower temperature can be provided for heat dissipation.

The present invention provides a heat-dissipating device having an air-guiding structure, which comprises a heat-conducting seat, a fin assembly, at least one heat pipe for serially connecting to the fin assembly and the heat-conducting seat, and a wind force fan assembly unit. The fin assembly is positioned above the heat-conducting seat and formed by arranging a plurality of heat-dissipating fins at intervals. As a result, airflow paths are formed between each heat-dissipating fin. The fan assembly unit is laterally provided at one side of the fin assembly. A space for lateral flow is formed between the heat-conducting seat and the fin assembly. The other side of the fin assembly is laterally provided with an air-guiding member. The air-guiding member has a guiding space for laterally communicating with the space. The airflow blown by the fan assembly unit can pass through the space and is received by the air-guiding member. Then, the airflow is guided to the portions to be heat-dissipated by the air-guiding member. In this way, the above objects can be achieved.

DETAILED DESCRIPTION OF THE INVENTION

In order to make the Examiner better understand the characteristics and the technical contents of the present invention, a detailed description relating to the present invention will be made with reference to the accompanying drawings. However, it should be understood that the drawings are illustrative but not used to limit the scope of the present invention.

Figure 1:
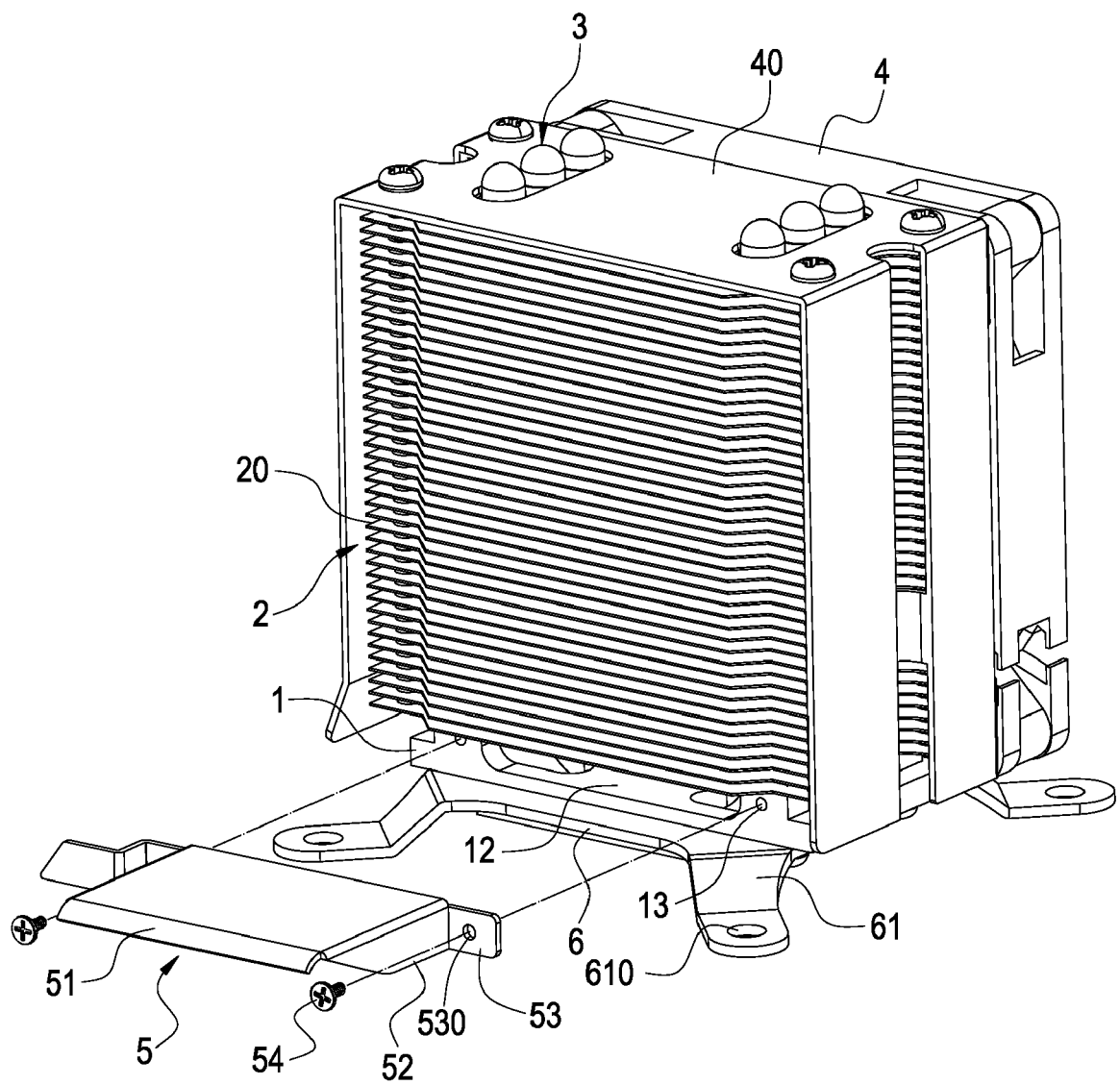
FIG. 1 is a perspective view showing the external appearance of the present invention.
Figure 2:
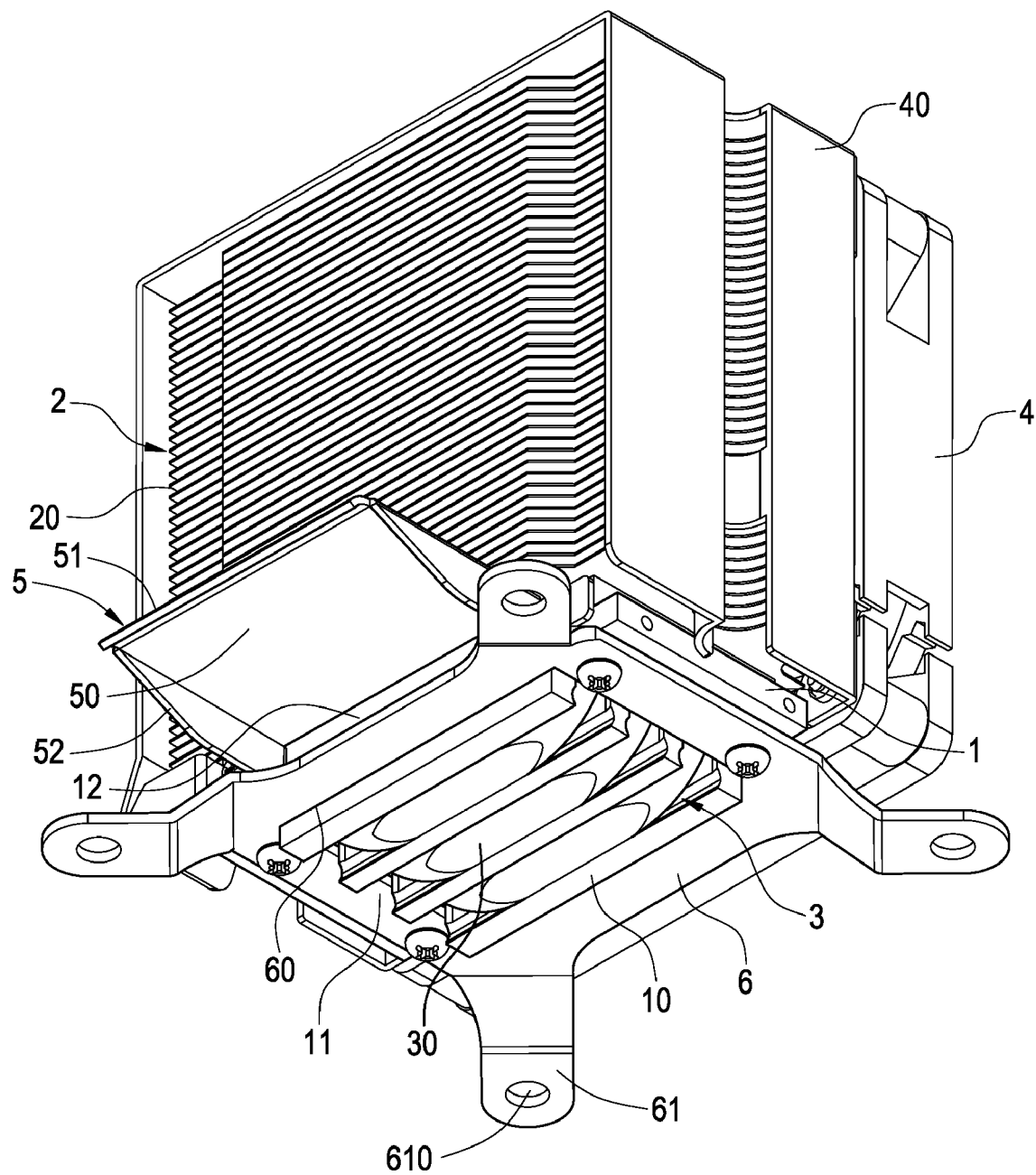
FIG. 2 is a perspective view showing the external appearance of the present invention taken from another view angle.
Figure 3:
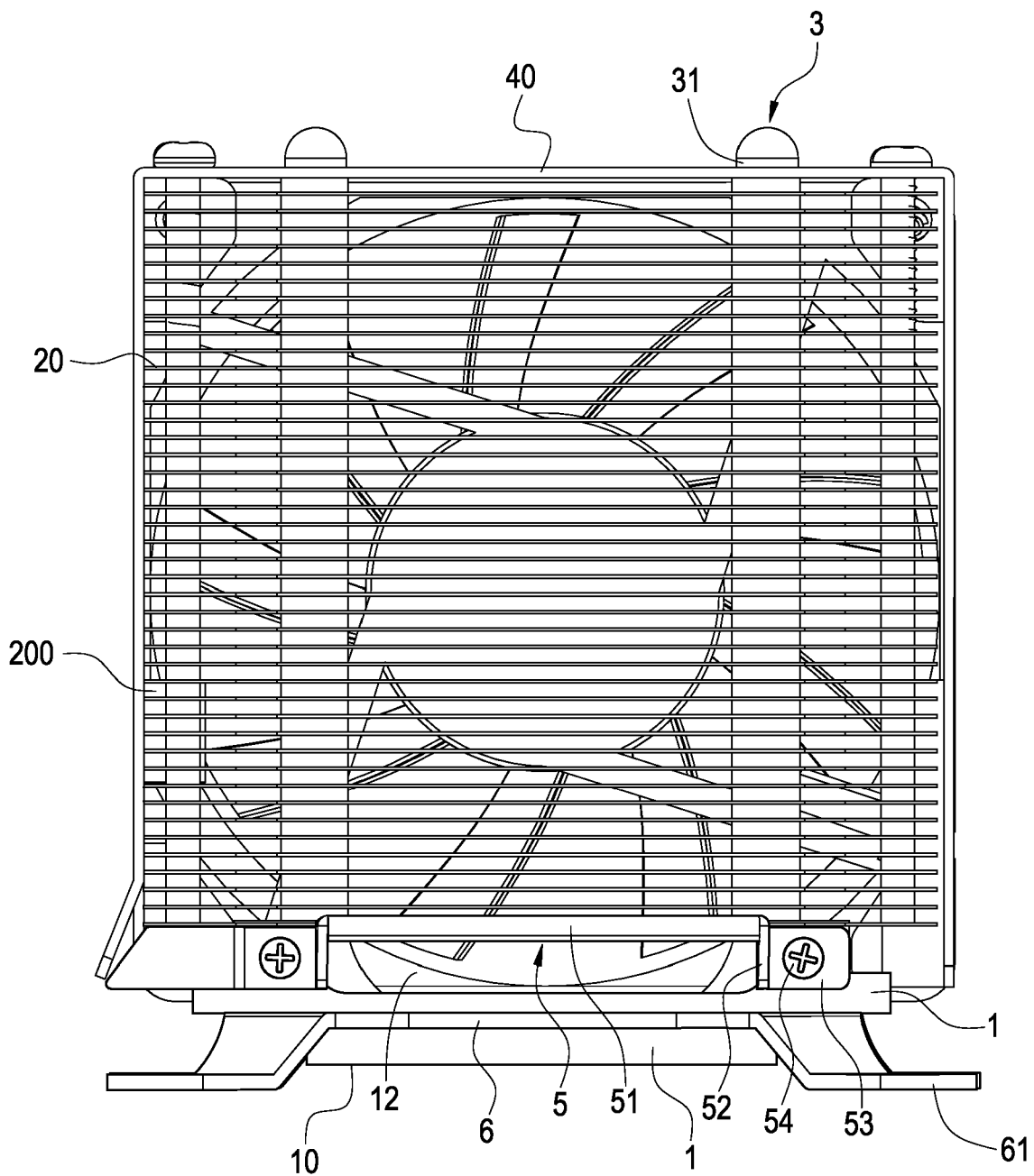
FIG. 3 is a front view of the present invention.

FIG. 1 is a perspective view showing the external appearance of the present invention. FIG. 2 is a perspective view showing the external appearance of the present invention taken from another view angle. FIG. 3 is a front view of the present invention. The present invention provides a heat-dissipating device having an air-guiding structure, which comprises a heat-conducting seat 1, a fin assembly 2, at least one heat pipe 3 and a fan assembly unit 4.

Figure 4:
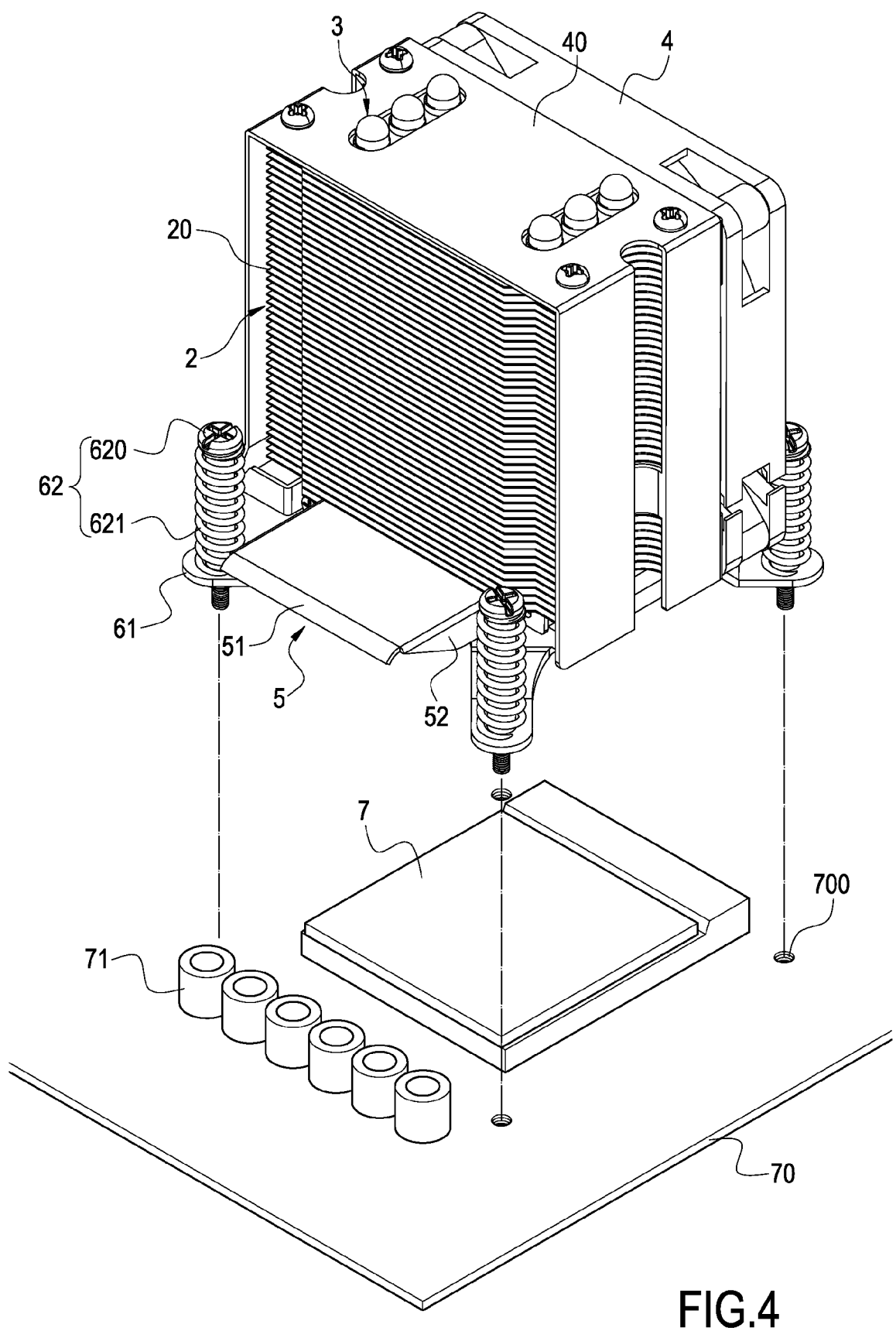
FIG. 4 is an exploded perspective view showing that the present invention is assembled on a heat source.

The heat-conducting seat 1 is made of materials having excellent heat conductivity (such as aluminum, copper or the like) and formed into a flat plate. The bottom surface of the heat-conducting seat 1 has a surface 10 to be heated so as to abut against a heat-generating electronic element 7 such as a central processing unit (CPU), as shown in FIG. 4. The surface 10 to be heated is a substantially flat surface. The surface 10 to be heated is recessed inwardly to form accommodating troughs 11. The heat pipe 3 can be pressed into the accommodating trough 11 and connected thereto. Therefore, depending on the number of the heat pipe 3 to be connected and basically with a one-to-one arrangement, the number of the heat pipes 3 is identical to that of the accommodating troughs 11.

Figure 5:
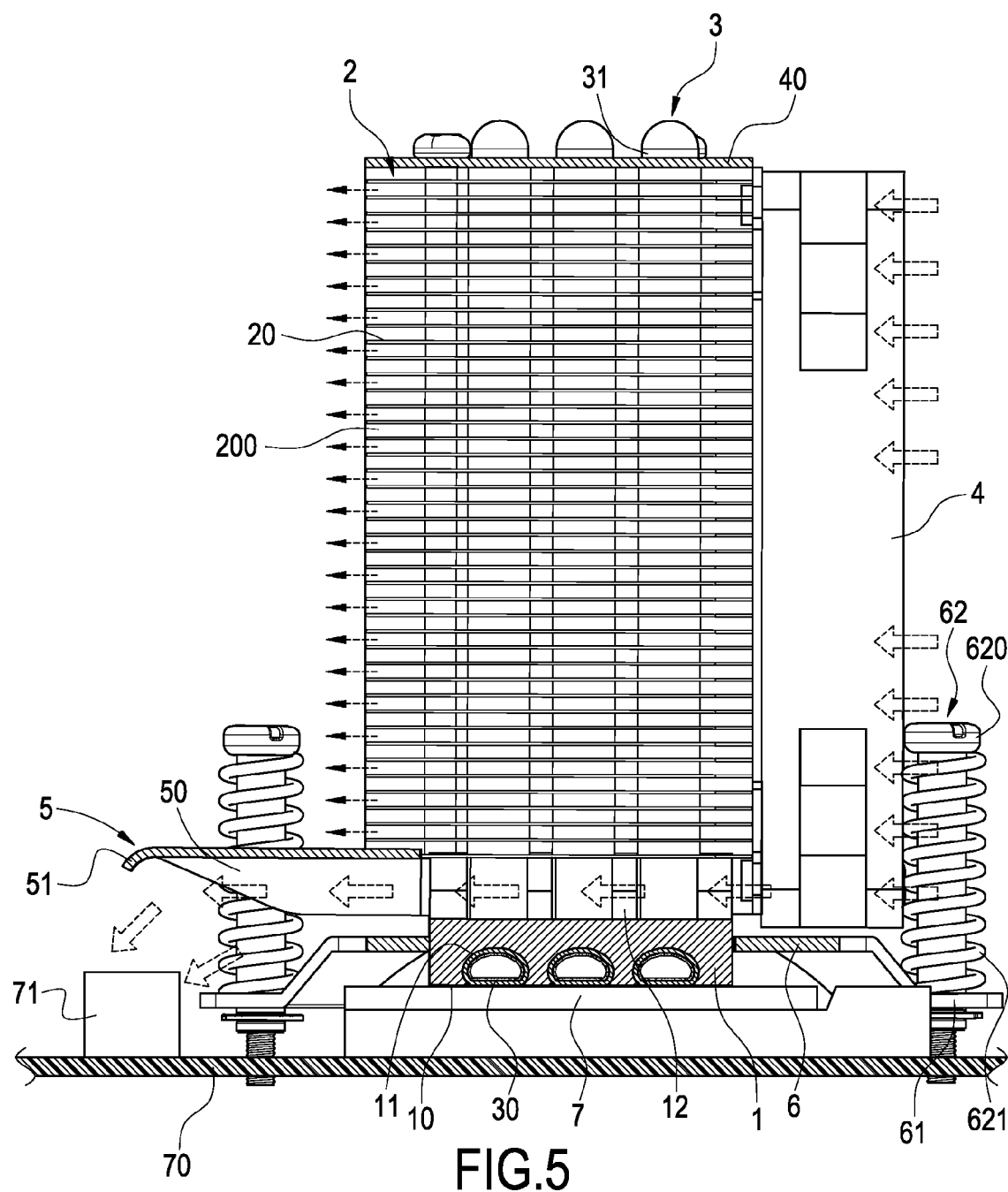
FIG. 5 is an assembled cross-sectional view of FIG. 4.

The fin assembly 2 is positioned on the top face of the heat-conducting seat 1 and formed by arranging successively a plurality of heat-dissipating fins 20 at intervals in an up-and-down direction. Airflow path 200 for lateral airflow is formed between each separated heat-dissipating fin 20 (as shown in FIG. 5). Also, each heat-dissipating fin 20 can be made of materials such as aluminum or copper.

Each heat pipe 3 can be formed into a U-lettered shape. Further, each heat pipe 3 has a portion 30 to be heated and a heat-dissipating portion 31 (as shown in FIG. 3). In the embodiment of the present invention, the bottom portion of each U-lettered heat pipe 3 is used to be the portion 30 to be heated. Both ends of the U-lettered heat pipe are used to be heat-dissipating portions 31. The portion 30 to be heated and the heat-dissipating portion 31 of each heat pipe 3 are thermally connected to the heat-conducting seat 1 and the fin assembly 2. Therefore, the portion 30 to be heated of the heat pipe 3 is pressed into the accommodating trough 11 of the heat-conducting seat 1, and the heat-dissipating portion 31 penetrates into each heat-dissipating fin 20 of the fin assembly 2. At the same time, the portion 30 to be heated of the heat pipe 3 exposes to the outside surface of the accommodating trough 11 and is flush with the surface 10 to be heated of the heat-conducting seat 1. Therefore, the heat pipe 3 can rapidly conduct the heat absorbed by the heat-conducting seat 1 or the portion 30 to be heated via a heat-conducting portion 32 to the heat-dissipating portion 31, and then via each heat-dissipating fin 20 of the fin assembly 2.

The wind force unit fan assembly unit 4 can be an axial flow fan for blowing cooling air toward each airflow path 200 of the fin assembly 2, thereby to produce a strong airflow and an airflow orientation. A ⊓-shaped wind mask air flow diverter 40 is provided to straddle on the fin assembly 2, so that the fan assembly unit 4 can be locked on the wind mask air flow diverter 40 and on one side of the fin assembly 2.

According to the present invention, a space 12 for lateral airflow is formed between the heat-conducting seat 1 and the fin assembly 2. The orientation of the space 12 conforms to that of each airflow path 200 of the fin assembly 2. Therefore, when the fan assembly unit 4 blows the cooling air toward each airflow path 200, the airflow generated by the fan assembly unit 4 can pass through the space 12. At the same time, the other side of the fin assembly 2 is provided with an air-guiding member 5. The air-guiding member 5 has a guiding space 50 for laterally communicating with the space 12, receiving the airflow passing through the space 12 and guiding the airflow to the portion to be heat-dissipated (such as the transistors 71) in the periphery of the heat-generating electronic element 7 (e.g. CPU), as shown in FIG. 4. The guiding space 50 can be enclosed by the body of the air-guiding member 5 and two side plates 52 extending downwardly from both sides of the body. A guiding piece 51 bending downwardly is formed at the front end of the body of the air-guiding member 5. With the above structure, the airflow can be further guided downwardly to blow to the portions to be heat-dissipated.

According to the above, in the embodiment of the present invention, sheet-like connecting portions 53 extend from the left and right sides of the rear end of the two side plates 52 of the air-guiding member 5. The connecting portion 53 is provided with a through hole 530 thereon. Screw holes 13 are provided at the positions of the heat-conducting seat 1 corresponding to the through holes. After a screwing element 54 such as screw penetrates into the through hole 530 of the connecting portion 53 and locked into the screw hole 13 of the heat-conducting seat 1, the air-guiding member 5 can be assembled on the heat-conducting seat 1. Of course, the air-guiding member 5 can also be assembled on the wind mask air flow diverter 40 or each heat-dissipating fin 20 of the fin assembly as long as the guiding space 50 of the air-guiding member 5 can be laterally communicated with the space 12.

In addition, the present invention is provided with a fixing seat 6 beneath the heat-conducting 1. The fixing seat 6 is provided with a hollowed portion 60 from which the surface 10 to be heated of the heat-conducting seat 1 can protrude downwardly. Sheet-like fixing legs 61 extend outwardly from the four corners of the fixing seat 6 for supporting upwardly the fixing seat. Each fixing leg 61 is provided with a through hole 610 for fixing the fixing seat 6 via the latter-mentioned fixing piece 62.

Therefore, with the above construction, the heat-dissipating device having the air-guiding structure in accordance with the present invention can be obtained.

As shown in FIG. 4, when assembling the present invention, a plurality of elastic fixing pieces 62 are positioned corresponding to each through 610 of the fixing leg 61, respectively to mount the fixing seat 6 together with the heat-conducting seat 1, fin assembly 2, heat pipe 3 and the fan assembly unit 4 on a main board 70. Each elastic fixing piece 62 comprises a bolt 620 and a spring 621 provided on the bolt 620. The bolt 620 penetrates the through hole 610 of the fixing leg 61 and is locked in the screw hole 700 of the main board 70, so that the surface 10 to be heated of the heat-conducting seat 1 can abut against the heat-generating electronic element 7 on the main board 70.

As shown in FIG. 5, since the most heat generated by the heat-generating electronic element 7 is conducted to the fin assembly 2 via the heat pipe 3, the temperature of the space 12 is not higher than that within each airflow path 200 even though the space 12 is located closer to the heat-generating element 7. Further, since the space 12 is broader than each airflow path 200, it is easier for the airflow in the space to communicate with the outside. As a result, it is not easy to accumulate heat therein, so that the temperature of the space is lower than that within each airflow path 200. Therefore, when the wind force unit fan assembly unit 4 blows toward each airflow path 200 and the space 12, the airflow passing through the space 12 can reach a lower temperature and is blown to the guiding space 50 of the air-guiding member 5, and in turn to the heat-generating elements (such as transistors) in the periphery of the heat-generating electronic element 7. In this way, the heat-dissipating effect can be enhanced.

According to the above, the present invention indeed achieves the desired effects and overcomes the drawbacks of prior art by employing the above structures. Therefore, the present invention involves the novelty and inventive steps, and conforms to the requirements for a utility model patent.

Although the present invention has been described with reference to the foregoing preferred embodiments, it will be understood that the invention is not limited to the details thereof Various equivalent variations and modifications can still be occurred to those skilled in this art in view of the teachings of the present invention. Thus, all such variations and equivalent modifications are also embraced within the scope of the invention as defined in the appended claims.

What is claimed is:

1. A heat-dissipating device having an air-guiding structure, comprising:

a heat-conducting seat;

a fin assembly positioned above the heat-conducting seat and formed by arranging a plurality of heat-dissipating fins at intervals, an airflow path formed between each heat-dissipating fin for laterally flowing the air;

a heat pipe having a portion to be heated and a heat-dissipating portion, the heat-dissipating portion of the heat pipe penetrating into each heat-dissipating fin and the portion of the heat pipe to be heated thermally connected to the heat-conducting seat;

a fan assembly unit provided at one side of the fin assembly; and an air flow diverter having a top plate and straddling the fin assembly for locking the fan assembly unit onto the one side of the fin assembly, said top plate having two slots allowing top ends of the heat pipes to pass therethrough, wherein a space for lateral airflow is formed between the heat-conducting seat and the fin assembly, the other side of the fin assembly is provided with an air-guiding member, and the air-guiding member has a guiding space for laterally communicating with the space formed between the heat-conducting seat and the fin assembly;

after the air blown by the fan assembly unit passes through the space formed between the heat-conducting seat and the fin assembly and is received by the air-guiding member, the air is guided to portions to the heat-dissipating portion of the heat pipe in a periphery of the heat-conducting seat via the air-guiding member.

2. The heat-dissipating device having an air-guiding structure according to claim 1, wherein the heat-dissipating seat is a flat plate.

3. The heat-dissipating device having an air-guiding structure according to claim 1, wherein the bottom surface of the heat-conducting seat has a surface to be heated, the surface to be heated is recessed inwardly to form an accommodating trough, the portion to be heated of the heat pipe is pressed into the accommodating trough, and the portion to be heated is exposed to the outside surface of the accommodating trough and flush with the surface to be heated.

4. The heat-dissipating device having an air-guiding structure according to claim 3, wherein the surface to be heated is a flat surface.

5. The heat-dissipating device having an air-guiding structure according to claim 3, wherein a fixing seat is provided beneath the heat-conducting seat and includes a hollowed portion from which the surface to be heated of the heat-conducting seat protrudes downwardly.

6. The heat-dissipating device having an air-guiding structure according to claim 1, wherein the air flow diverter is formed in a ⊓-letter shape.

7. The heat-dissipating device having an air-guiding structure according to claim 1, wherein the heat pipe is formed into a U-lettered shape.

8. The heat-dissipating device having an air-guiding structure according to claim 1, wherein the fan assembly unit is a heat-dissipating fan.

9. The heat-dissipating device having an air-guiding structure according to claim 1, wherein the guiding space of the air-guiding member is enclosed by a body of the guiding member and two side plates extending downwardly from both sides of the body.

10. The heat-dissipating device having an air-guiding structure according to claim 9, wherein the air-guiding member is formed at the front end of the body with a guiding piece bending downwardly.

11. The heat-dissipating device having an air-guiding structure according to claim 10, wherein sheet-like connecting portions extend from left and right sides of the rear end of the two side plates of the air-guiding member for assembling the air-guiding member on the heat-conducting seat.

12. The heat-dissipating device having an air-guiding structure according to claim 1, wherein the air-guiding member is assembled on the heat-conducting seat.

13. The heat-dissipating device having an air-guiding structure according to claim 1, wherein the airflow diverter has two side plates, each of the side plates having two parallel parts and a channel formed between the two parts.

* * * * *